(12) United States Patent
Chen (10) Patent No.: US 7,556,518 B2
(45) Date of Patent: Jul. 7, 2009

(54) BURN-IN SOCKET HAVING LOADING PLATE WITH UNEVEN SEATING SURFACE

(75) Inventor: Ming-Yue Chen, Tu-cheng (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 12/156,023

(22) Filed: May 28, 2008

(65) Prior Publication Data

US 2008/0299792 A1    Dec. 4, 2008

(51) Int. Cl.
*H01R 13/62* (2006.01)
*H01R 13/15* (2006.01)

(52) U.S. Cl. .................................... 439/259

(58) Field of Classification Search .............. 439/68, 439/71, 259, 266, 70, 268, 264, 263, 342
See application file for complete search history.

(56) References Cited

U.S. PATENT DOCUMENTS 6,602,084 B2    8/2003    Sagano
7,210,951 B2    5/2007    Sinclair

FOREIGN PATENT DOCUMENTS

CN    2718814 Y    8/2005

*Primary Examiner*—Javaid Nasri
(74) *Attorney, Agent, or Firm*—Wei Te Chung (57) ABSTRACT

A burn-in socket for receiving an IC package includes a base defining an opening for loading the IC package. A loading plate is mounted within the base. The loading plate has a seating surface with a number of holes defined therein. A contact socket is located under the loading plate. A number of contacts are received in the contact socket. Each contact has one end extending into the hole in the seating surface of the loading plate for contact with a solder ball of the IC package. The seating surface comprises at least one lower plane and at least one upper plane. At least the upper plane is formed with the holes.

8 Claims, 10 Drawing Sheets

BURN-IN SOCKET HAVING LOADING PLATE WITH UNEVEN SEATING SURFACE

BACKGROUND OF THE INVENTION

1. Field of the Invention

This invention relates generally to a burn-in socket for removably loading an IC package having a plurality of solder balls in order to make an electrical connection with contacts of the socket, and more particularly, to a burn-in socket having a loading plate adapt for a type of IC package which has protrusions at the bottom thereof, and else adapt for at least two type of IC packages of different configurations.

2. Description of the Related Art

IC packages are usually subjected to pass a so-called burn-in test, in which the IC packages are placed in an oven and operated for a time at an elevated temperature, and under a voltage source that is greater than the rated value. Those IC packages that continue to perform satisfactorily are then approved for shipment.

An IC package generally defines a top surface and a bottom surface. A plurality of conducting leads, for example solder balls, are attached to the bottom surface for electrical contact with the terminals of a burn-in socket. One type of the IC package for example is called DDR package (DDR hereinafter), which is widely used in memory storage. Parts of the types of the conventional DDRs are equipped with some protrusions or ribs at the bottom surface and between two sets of solder balls, according to the IC designers.

U.S. Pat. No. 7,210,951 issued to Sinclair on May 1, 2007 discloses a top loaded burn-in socket for forming a plurality of electrical connections between a ball gird array (BGA) package having a plurality of conductive ball leads and an electrical component. The socket assembly includes a plurality of resilient electrical contacts; a cam being configured to position the contacts from a first position to a second position; a device guide plate including a plurality of openings for receiving the ball leads; and an actuating mechanism configured to interact with the cam to position the contacts, wherein an upper portion of the contacts engages the ball leads between the upper portion and an inclined surface of the device guide plate openings. Each ball is thus held in a manner that does not require the use of a hold down mechanism for effecting electrical continuity between the BGA package and the contacts of the subject burn-in socket.

However, it is noted that the one problem is likely to be caused when such an IC package like DDR is loaded in the above burn-in socket that the protrusions at the bottom surface of DDR interfere with the planar up surface 90 of the burn-in socket, and it will prevent the insertion of solder balls of the IC package into the plurality of holes formed in the planar up surface 90. Another problem is also exists in this conventional burn-in socket, that only one type of IC package could be loaded and tested. The guide plate has to be redesigned when a new IC package of different configuration is to be loaded, and therefore the cost is raised.

BRIEF SUMMARY OF THE INVENTION

Accordingly, it is an object of the present invention to provide a burn-in socket adapted for an IC package with protrusions at the bottom thereof.

It is another object of the present invention to provide a burn-in socket adapted for at least two types of IC packages of different configurations.

According to one aspect of the present invention, a burn-in socket for receiving an IC package is provided. The burn-in socket includes a base defining an opening for loading the IC package. A loading plate is mounted within the base. The loading plate has a seating surface with a plurality of holes defined therein. A contact socket is located under the loading plate. A plurality of contacts are received in the contact socket. Each contact has one end extending into the hole in the seating surface of the loading plate for contact with a solder ball of the IC package. The seating surface comprises at least one lower plane and at least one upper plane. At least the upper plane is formed with the holes.

According to another aspect of the present invention, a burn-in socket for receiving an IC package is provided. The burn-in socket includes a base defining an opening for loading the IC package. A loading plate is mounted within the base. The loading plate has a seating surface with a plurality of holes defined therein. A contact socket is located under the loading plate. A plurality of contacts are received in the contact socket. Each contact has one end extending into the hole in the seating surface of the loading plate for contact with a solder ball of the IC package. The seating surface has at least one recess for accommodation of at least one protrusion which is formed at a bottom surface of the IC package.

Other objects, advantages and novel features of the present invention will become more apparent from the following detailed description of the present embodiment when taken in conjunction with the accompanying drawings.

DETAILED DESCRIPTION OF THE INVENTION

Following is the description of the best embodiment of the burn-in socket 1 of present invention. In this best embodiment, the burn-in socket 1 is designed to be capable of receiving two IC packages synchronously. The burn-in socket 1 in use is generally mounted on a printed circuit board (not shown).

Referring to FIG. 1 to FIG. 3 and FIG. 5 to FIG. 7, the burn-in socket 100 includes a base 1, a pair of loading plates 5 mounted with the base 1, and a contact socket 7 located under the loading plates 5.

Figure 4:
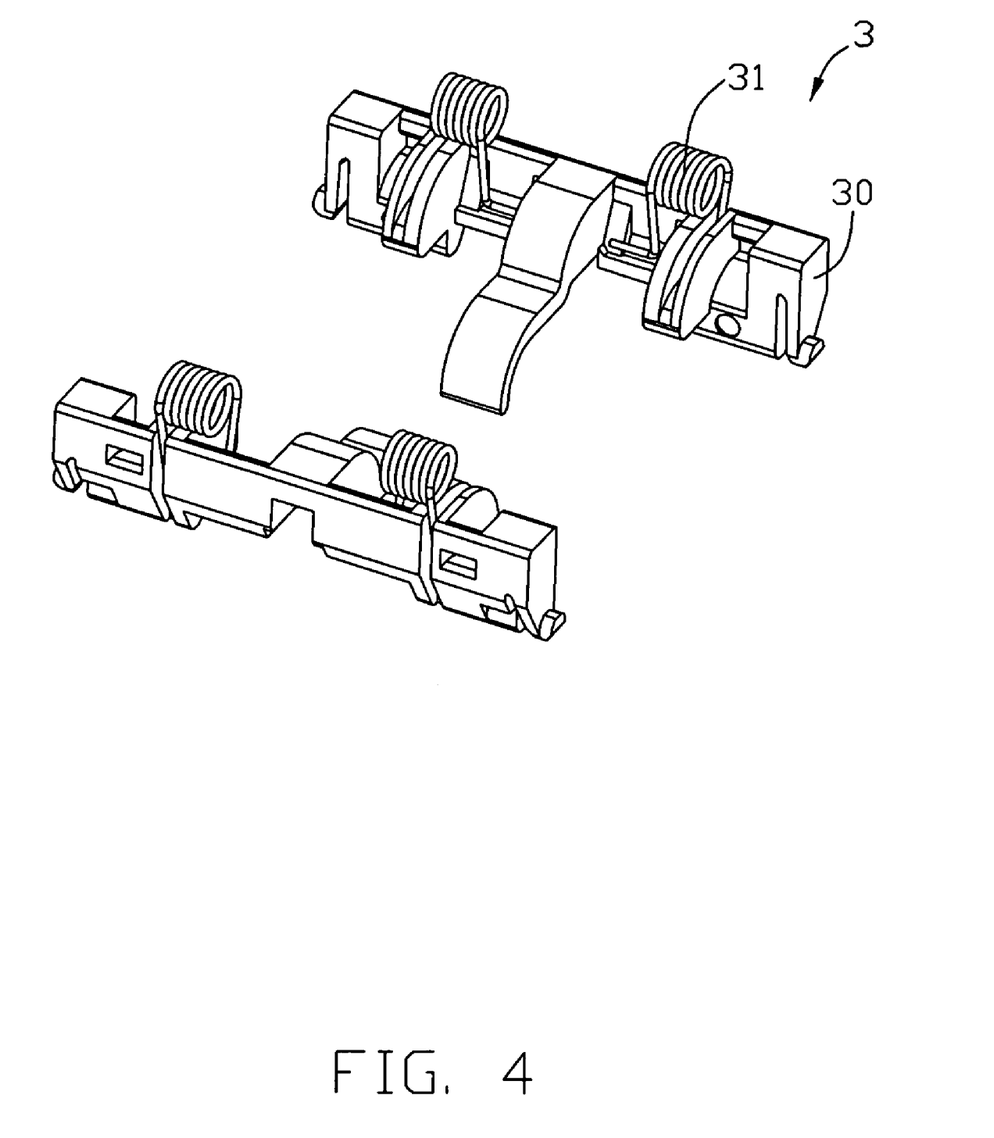
FIG. 4 is an assembled, perspective view of latching mechanisms according to the embodiment of the present invention.
Figure 5:
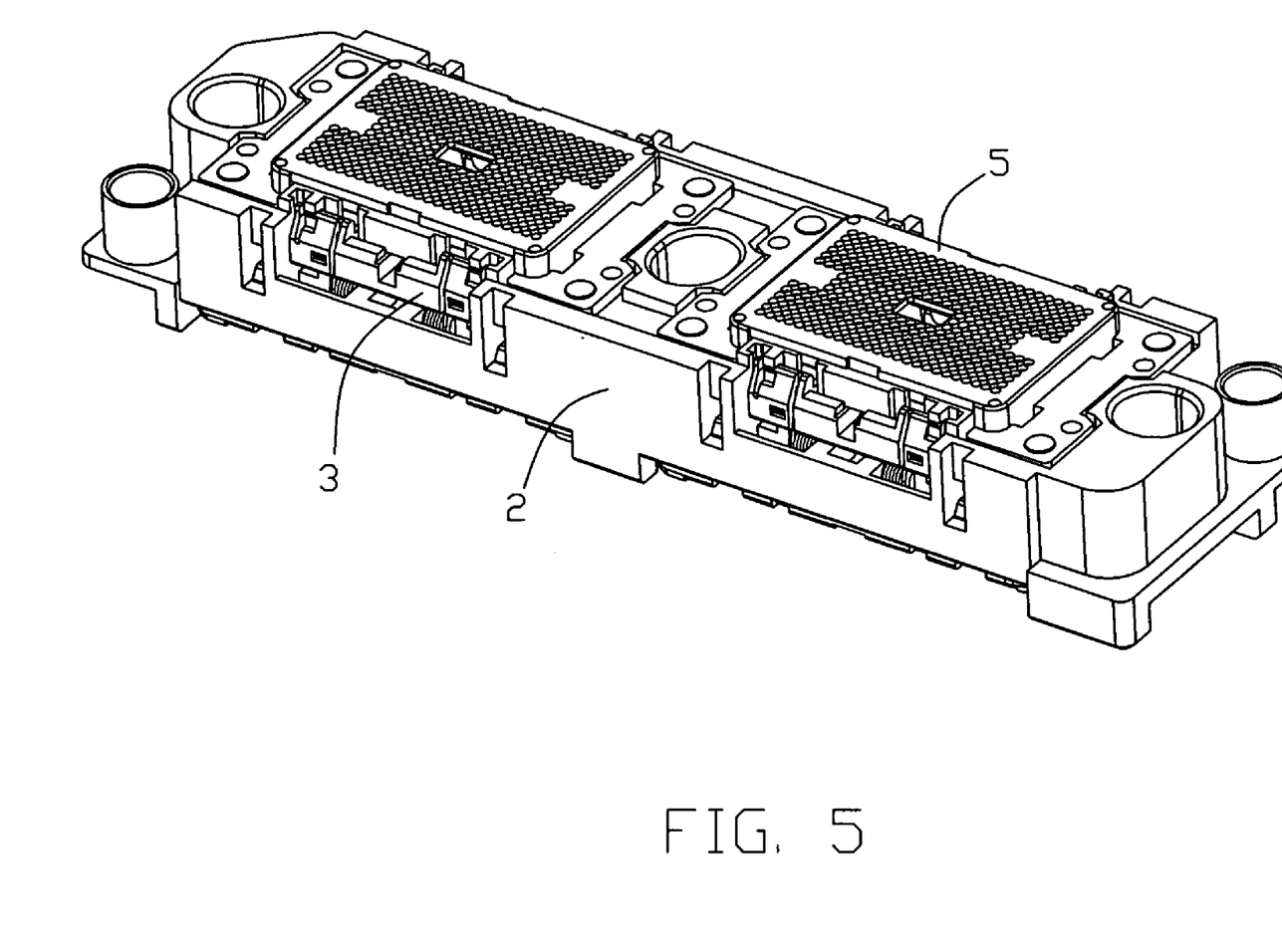
FIG. 5 is a sectional assembled, perspective view of the burn-in socket in a closed state, according to the embodiment of the present invention.
Figure 6:
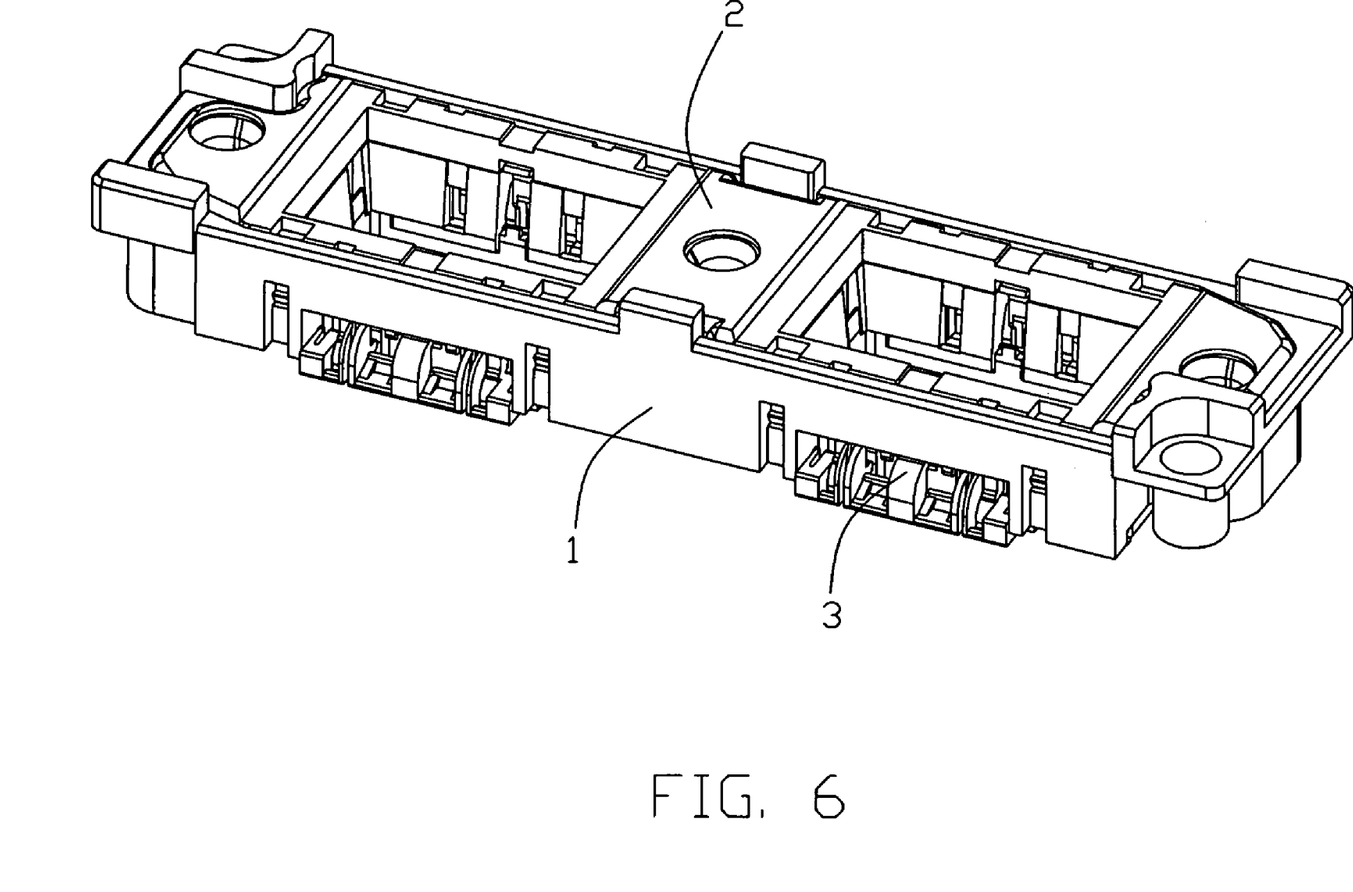
FIG. 6 is a sectional assembled, perspective view of the burn-in socket in a open state, according to the embodiment of the present invention.
Figure 7:
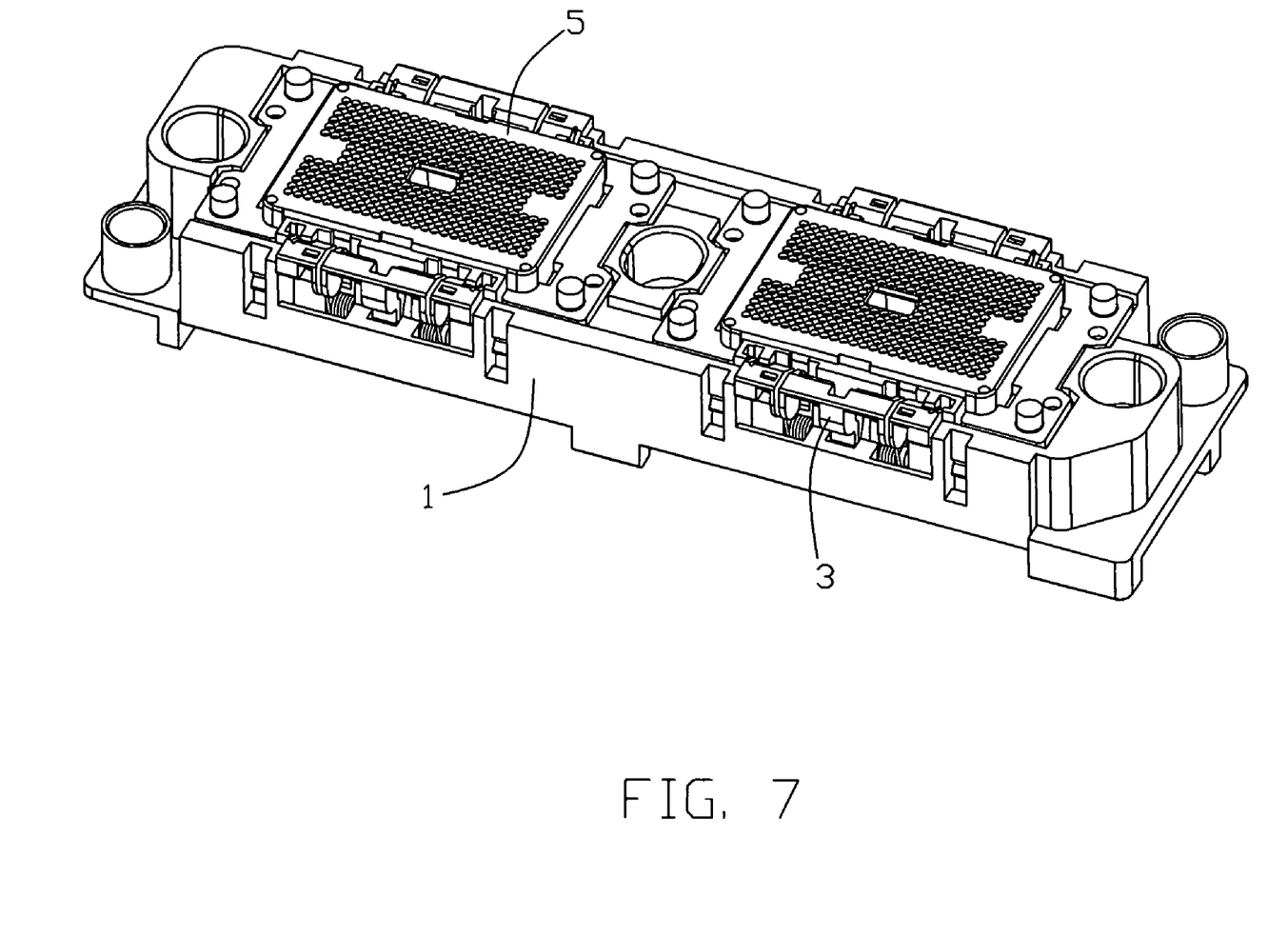
FIG. 7 is another angled view of FIG. 6.

The base 1 has a longwise configuration and defines a pair of openings 10 for loading the IC packages. A driver 2 with a similar longwise configuration as the base 1 is movably mounted above the base 1 to drive two pairs of latching mechanisms 3. The driver 2 also defines a pair of openings 20, respectively corresponding to the openings 10 of base 1 to load the IC packages. The driver 2 is driven by a downward operation force and is urged to move downwardly to drive the latching mechanism 3. Referring to FIG. 4, the latching mechanism 3 constitutes of a latch 30 and a torsion spring 31 engaging with the latch 30. The performance of the latch mechanisms 3 being driven by the driver 2, as a conventional technology, will not be described here again. When the driver 2 is fully pressed to a lowest position, the burn-in socket 100 is in an open state, with the latches 30 turned upwardly ready for loading the IC package. The driver 2 gets back to its original position by elastic force generated by springs 21 when the operation force is released, and the burn-in socket turns to be a closed state, with the latches 30 closed for latching the IC package.

Figure 1:
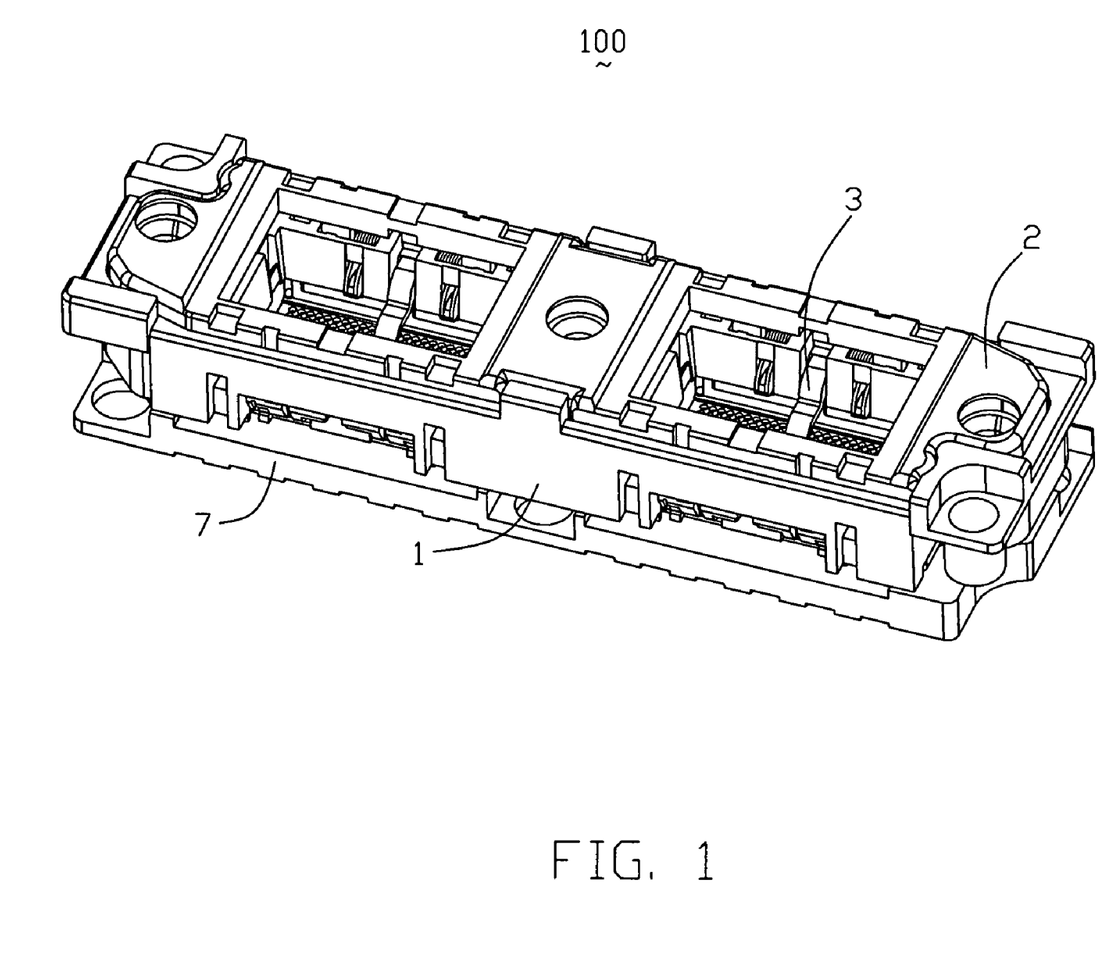
FIG. 1 is an assembled, perspective view of a burn-in socket according to an embodiment of the present invention.
Figure 2:
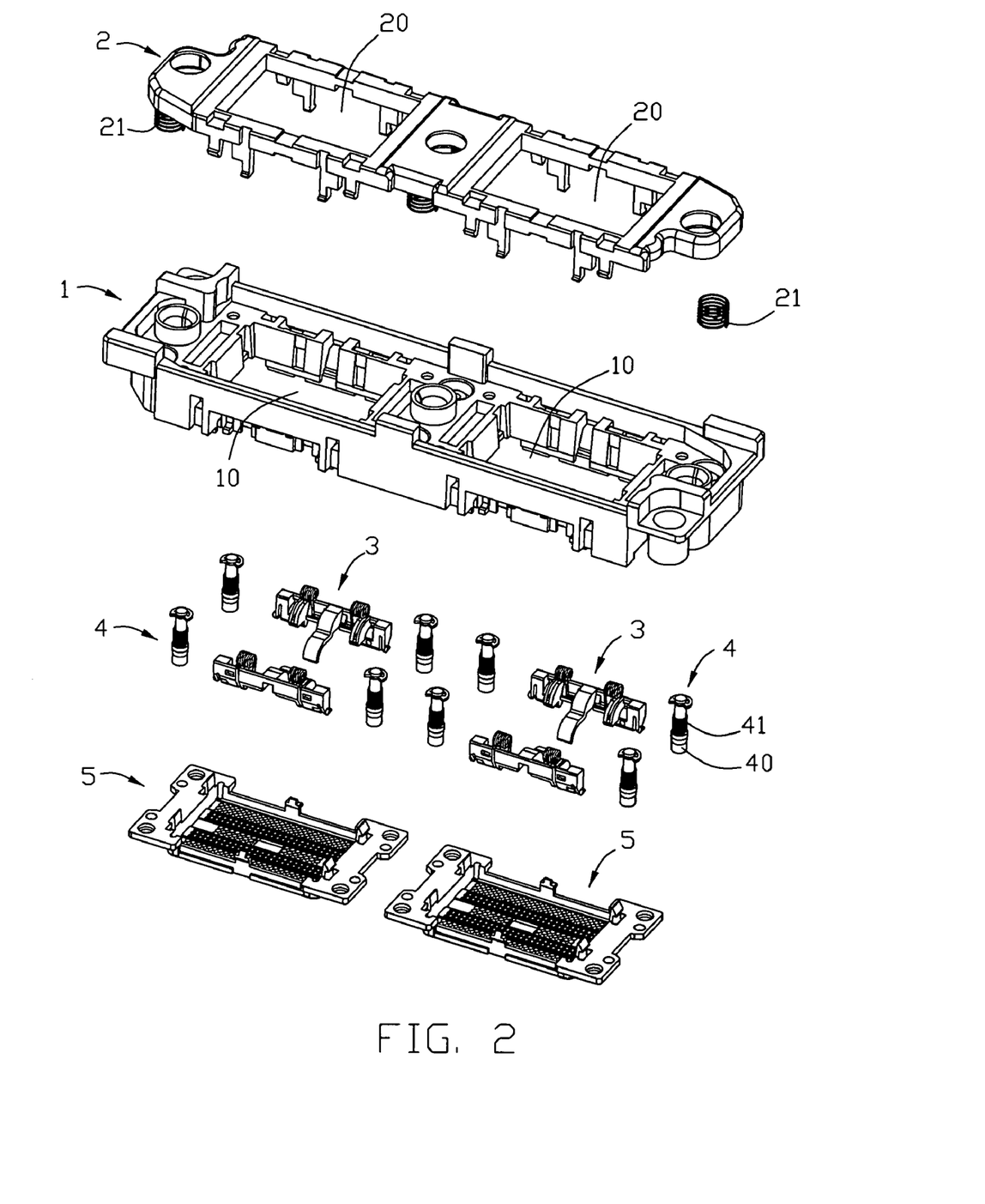
FIG. 2 is a sectional exploded, perspective view of the burn-in socket.
Figure 3:
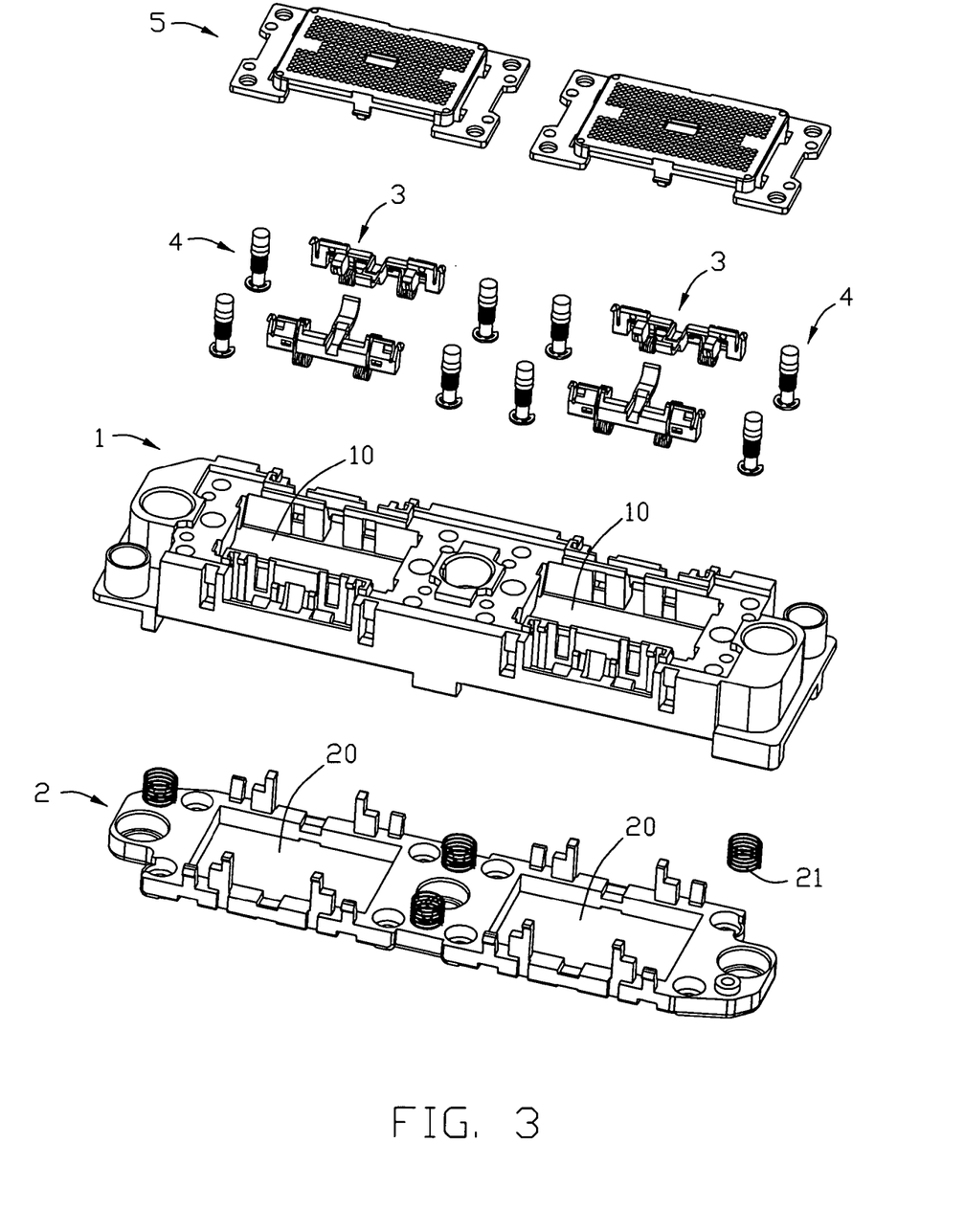
FIG. 3 is an opposite view of the FIG. 2.
Figure 10:
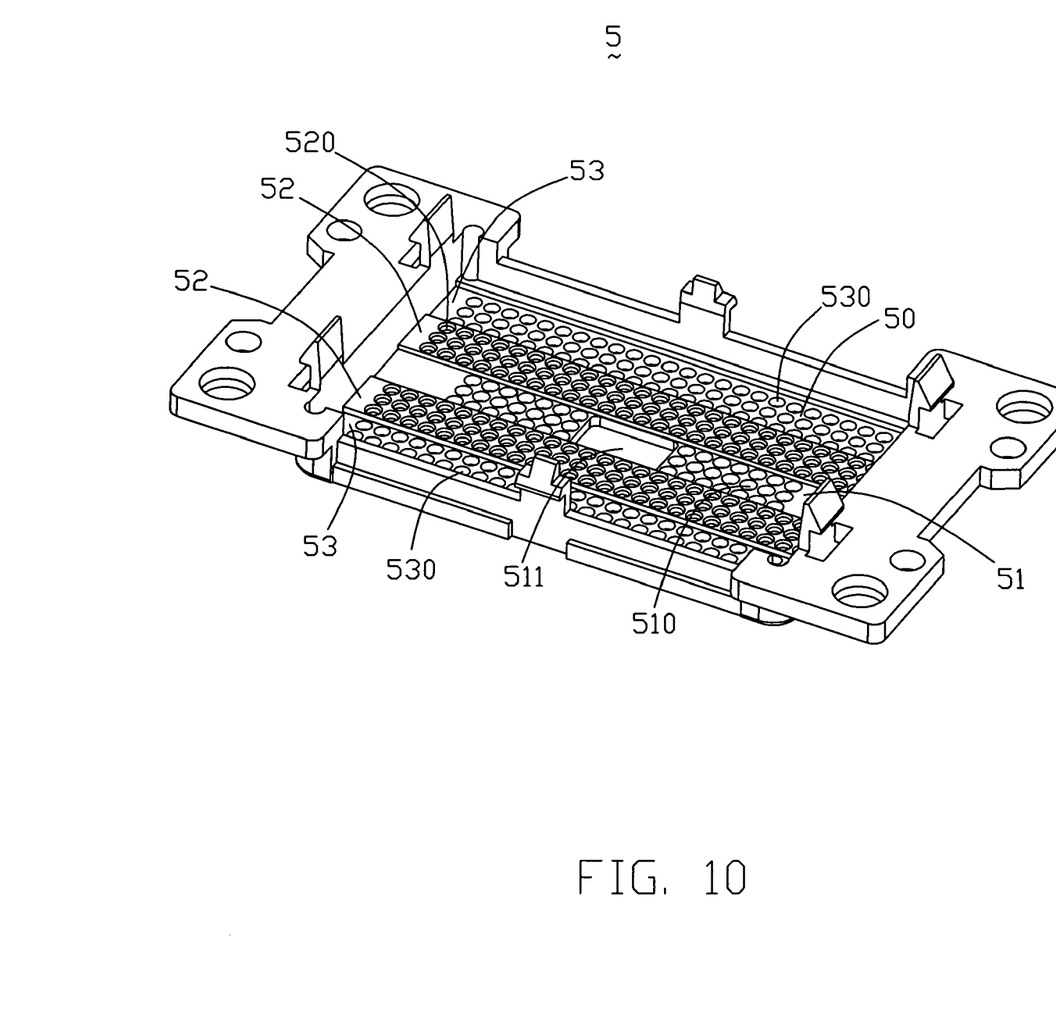
FIG. 10 is a perspective view of a loading plate according to the embodiment of the present invention.

Please now referring to FIG. 2-3 and FIG. 10, the pair of loading plates 5 are mounted at the bottom of the base 1. The loading plate 5 and the base 1 are also positioned with each other by means of lifting elements 4, each of which is equipped by a rod 40 and a spring 41. Another function of the lifting element 4 is to support the loading plate 5 and urge it to stick to the IC package. The loading plate 5 is made of dielectric material and has an approximate rectangular configuration. The loading plate 5 has a seating surface 50 at the middle portion for supporting the IC package. The seating surface 50 is formed with a un-flat configuration, which constitutes of a central lower plane 51, a pair of upper planes 52 respectively at two lateral sides of the central lower plane 51 and abut against the central lower plane 51, respectively, and a pair of side lower planes 53 located at the side-most position of the seating surface 50 and respectively abuts against one upper plane 52. In other words, upper planes 52 and lower planes 53 are alternately arranged. Each lower plane 51, 53 defines a recess (not labeled), respectively. All the central lower planes 51, the upper planes 52 and the side lower planes 53 are respectively formed with a set of holes 510, 520, 530. Further a rectangular opening 511 is formed in the middle of the central lower plane 51 and divides the holes 510 into two groups. A sensor (not shown) could be used to inspect the loading of the IC package through the opening 511.

Figure 8:
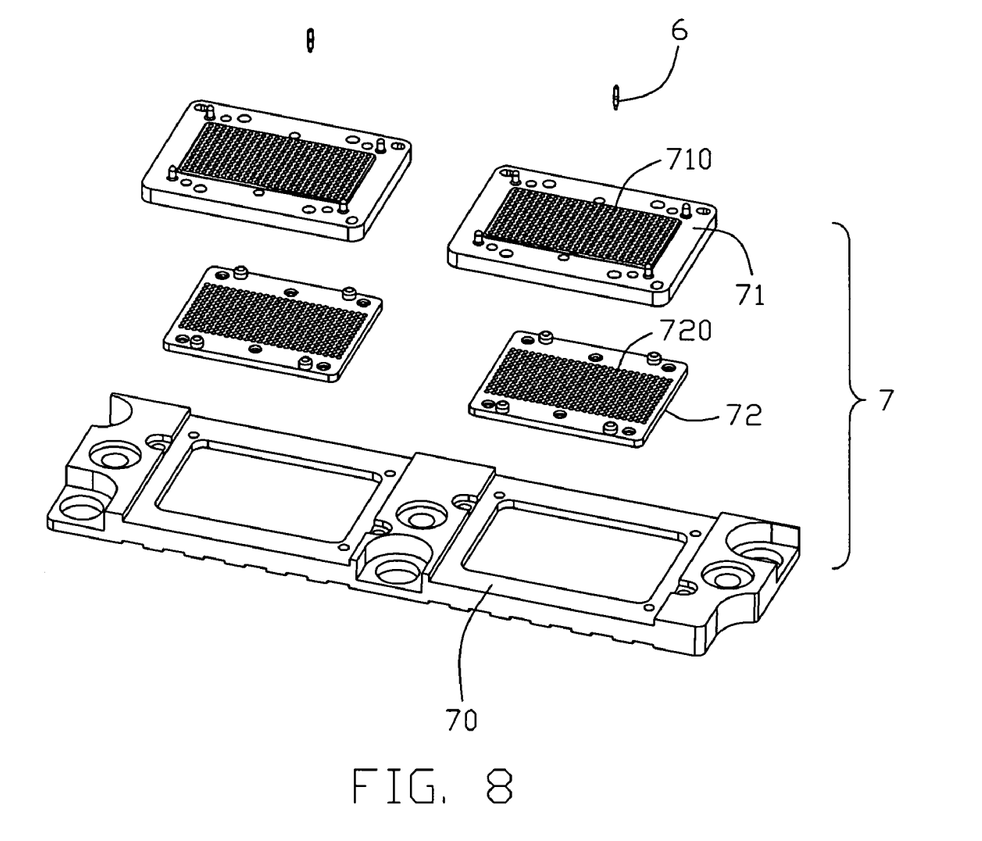
FIG. 8 is an exploded, perspective view of contact socket according to the embodiment of the present invention.
Figure 9:
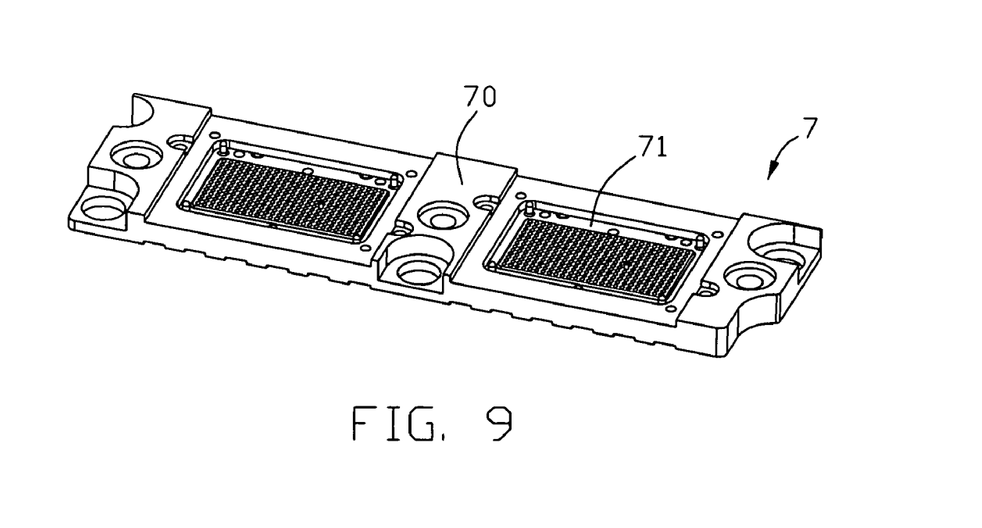
FIG. 9 is an assembled, perspective view of FIG. 8.

Please now referring to FIG. 8 and FIG. 9, the contact socket 7 in use is normally positioned on a circuit board (not shown), and then the assembly of base 1, cover 2 and loading plates 5 is laid on the contact socket 7. The contact socket 7 includes a frame 70 formed with a similar longwise configuration as the base 1 and the cover 2, a pair of top plate 71, and a pair of bottom plate 72. The top plate 71 is stacked on corresponding bottom plate 71, and then are together mounted within the frame 70. The top plate 71 and bottom plate 72 are formed with a plurality of passageways 710, 720, respectively. A plurality of contacts 6 are vertically received in the passageways 710, 720, each with one end extending upwardly out of the top plate 71 and extending into the hole 510, 520, 530 to contact with the solder ball of the IC package, and the other end contacting with an electric pad (not shown) on the circuit board.

Figure 11A:
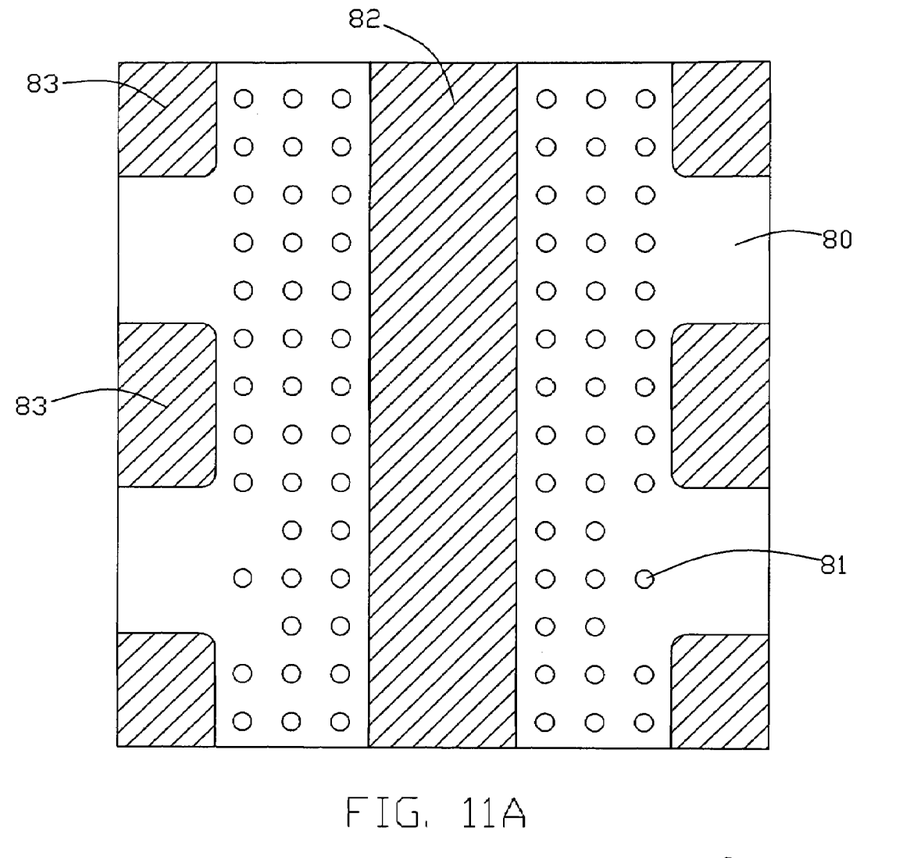
FIG. 11A is a bottom view of an IC package to be tested in the burn-in socket of present invention.
Figure 11B:
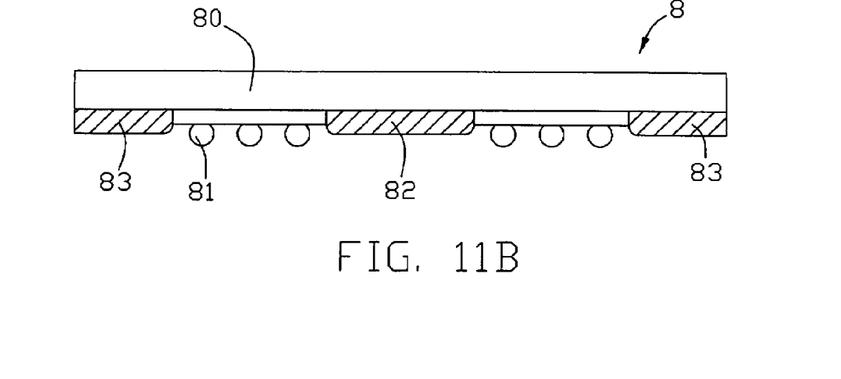
FIG. 11B is a side view of the IC package in the FIG. 11A.

Referring to FIG. 11A and FIG. 11B, it is a special IC package 8 that proper to be tested in the burn-in socket 100 of present invention. The IC package 8 comprises a plate-shaped body 80 and two groups of solder balls 81 attached at the bottom surface of the body 80. A longitude protrusion 82 is formed between the two groups of solder balls 81, and further a plurality of small protrusions 83 are formed at two sides of the bottom surface of the body 80. The lowest point of each protrusion 82, 83 in a vertical direction is higher than the lowest point of the solder ball 81. When this IC package 8 is loaded to the burn-in socket 100 to seat on the loading surface 50 of the loading plate 5, the longitude protrusion 82 is accommodated in the recess defined by the central lower plane 51, and the small protrusions 83 at side positions are accommodated in the recesses defined by the side lower planes 53. Therefore, the solder balls 81 are able to be inserted to the holes 520 in the upper planes 52 without any block, to achieve electrical connection with the contacts 6 which respectively has one end extending into the hole 520.

It can be seen that only the contacts 6 which extend into the holes 520 of upper planes 52 are used to be connected with the IC package 8. Further, another type of IC package which has different configuration as the above IC package 8 is also proper to be test in the IC package 100 of the present invention. For example, different number of the solder balls or different arrangement of the solder balls is adopted, and in these cases, the contacts 6 which extend to the holes 510, 530 of the lower planes 51, 53 may be used.

What is claimed is:

1. A burn-in socket for receiving an IC package comprising: a base defining an opening for loading the IC package therein; a loading plate mounted within the base, the loading plate having a seating surface with a plurality of holes defined therein; a contact socket located under the loading plate; and a plurality of contacts received in the contact socket, each contact having one end extending into the hole in the seating surface of the loading plate for contact with a solder ball of the IC package; wherein the seating surface comprises at least one lower plane and at least one upper plane, and at least said upper plane is formed with said holes; wherein the loading plate has a plurality of lower planes and a plurality of upper planes alternately arranged with each other thereon, wherein one of the lower planes is located in a central region of said loading plate; wherein the central lower plane has an opening formed therein for inspecting the loading of the IC package.

2. The burn-in socket according to claim 1, further comprising a cover which is provided to drive at least one latching mechanisim, the cover moving in a vertical direction relative to the base.

3. The burn-in socket according to claim 1, wherein the contact socket comprises a frame and at least one plate mounted within the frame, the plate being formed with a plurality of passageways for receiving the contacts.

4. The burn-in socket according to claim 1, at least one lifting element is provided to support the loading plate and urge it to stick to the IC package.

5. A burn-in socket for receiving an IC package comprising: a base defining an opening for loading the IC package; a loading plate mounted within the base, the loading plate having a seating surface with a plurality of holes defined therein; a contact socket located under the loading plate; and a plurality of contacts received in the contact socket, each contact having one end extending into the hole in the seating surface of the loading plate for contact with a solder ball of the IC package; wherein the seating surface has at least one recess for accommodation of at least one protrusion which is formed at a bottom surface of the IC package; wherein the loading plate forms a central lower plane and a pair of side lower planes, each of said central and side lower planes defining said recess therein, and a pair of upprr planes each located between the central lower plane and the corresponding side lower plane; wherein all the lower planes and upper planes are alternately arranged; wherein the central lower plane has an opening formed therein for inspecting the loading of the IC package.

6. The burn-in socket according to claim 5, further comprising a cover which is provided to drive at least one latching mechanisim, the cover moving in vertical direction relative to the base.

7. The burn-in socket according to claim 5, wherein the contact socket comprises a frame and at least one plate mounted within the frame, the plate being formed with a plurality of passageways for receiving the contacts.

8. The burn-in socket according to claim 5, at least one lifting element is provided to support the loading plate and urge it to stick to the IC package.

* * * * *